United States Patent
Tran et al.

(10) Patent No.: US 8,735,960 B2
(45) Date of Patent: May 27, 2014

(54) HIGH ULTRAVIOLET LIGHT ABSORBANCE SILICON OXYNITRIDE FILM FOR IMPROVED FLASH MEMORY DEVICE PERFORMANCE

(75) Inventors: Minh Q. Tran, Milpitas, CA (US);
Minh-Van Ngo, Fremont, CA (US);
Alexander H. Nickel, Santa Clara, CA (US); Sung Jin Kim, Palo Alto, CA (US); Simon Chan, Saratoga, CA (US);
Ning Cheng, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/313,134

(22) Filed: Nov. 17, 2008

(65) Prior Publication Data
US 2010/0123178 A1    May 20, 2010

(51) Int. Cl.
*H01L 29/788* (2006.01)
(52) U.S. Cl.
USPC ............ 257/316; 257/E21.507; 257/E21.641; 438/257
(58) Field of Classification Search
USPC .......................................... 438/740
See application file for complete search history.

(56) References Cited

U.S. PATENT DOCUMENTS

| | | | | |
|---|---|---|---|---|
| 6,051,870 A * | 4/2000 | Ngo | ............... | 257/519 |
| 6,136,649 A * | 10/2000 | Hui et al. | ............ | 438/257 |
| 6,235,583 B1 * | 5/2001 | Kawata et al. | ............ | 438/257 |
| 6,410,443 B1 * | 6/2002 | Avanzino et al. | ............ | 438/693 |
| 6,410,461 B1 * | 6/2002 | Gao et al. | ............ | 438/786 |
| 6,894,342 B1 * | 5/2005 | Hui et al. | ............ | 257/317 |
| 6,989,563 B1 * | 1/2006 | Achuthan et al. | ............ | 257/315 |
| 2001/0005630 A1 * | 6/2001 | Kim et al. | ............ | 438/689 |
| 2002/0090784 A1 * | 7/2002 | Yoon | ............ | 438/257 |
| 2002/0115256 A1 * | 8/2002 | Lee et al. | ............ | 438/262 |
| 2005/0282395 A1 * | 12/2005 | Chang et al. | ............ | 438/740 |
| 2006/0138463 A1 * | 6/2006 | Kim et al. | ............ | 257/202 |
| 2007/0087502 A1 * | 4/2007 | Chung-Zen | ............ | 438/257 |

* cited by examiner

*Primary Examiner* — W. Wendy Kuo
*Assistant Examiner* — Shaka White

(57) ABSTRACT

An ultraviolet light absorbent silicon oxynitride layer overlies a memory cell including a pair of source/drains, a gate insulator, a floating gate, a dielectric layer, and a control gate. A conductor is disposed through the silicon oxynitride layer for electrical connection to the control gate, and another conductor is disposed through the silicon oxynitride layer for electrical connection to a source/drain.

16 Claims, 10 Drawing Sheets

US 8,735,960 B2

HIGH ULTRAVIOLET LIGHT ABSORBANCE SILICON OXYNITRIDE FILM FOR IMPROVED FLASH MEMORY DEVICE PERFORMANCE

BACKGROUND OF THE INVENTION

1. Field of the Invention

This invention relates generally to memory devices, and more particularly, to an approach for protecting flash memory cells from ultraviolet (UV) light.

2. Discussion of the Related Art

FIG. 1 illustrates a flash memory cell 20 in accordance with the prior art. As such, the cell includes a semiconductor substrate 22 in which source/drains 24, 26 are formed. Successive layers of gate dielectric 28, storage layer 30, dielectric 32 and control gate 34 are formed on the substrate 22. Silicide layers 36, 38, 40 are formed on the source/drains 24, 26 and the control gate 34. The memory cell 20 is programmable, upon application of appropriate voltages, by moving electrons from a source/drain through the gate dielectric 28 and into the storage layer 30, where such electrons are stored. The memory cell 20 is erasable, again upon application of appropriate voltages, by removing electrons from the storage layer 30 through the gate dielectric 28 and into a source/drain, as is well known.

Overlying this structure is a BPSG insulating layer 42, and formed on the BPSG layer 42 is a silicon-rich oxide (SiRO) layer 44 the utility of which will be described further on. A silicon dioxide cap layer 46 is provided on the SiRO layer 44. A silicon nitride layer 47 is provided on the cap layer 46, and another silicon dioxide layer 48 is provided on the silicon nitride layer 47. A conductor 50 extends through the silicon dioxide layer 48, silicon nitride layer 47, silicon dioxide cap layer 46, SiRO layer 44, BPSG layer 42, and is electrically connected to silicide layer 36. Another conductor 52 extends through the silicon dioxide layer 48, silicon nitride layer 47, silicon dioxide cap layer 46, SiRO layer 44, BPSG layer 42, and is electrically connected to silicide layer 40.

As noted above, the movement of electrons into and from the storage layer 30 determines the state of the memory cell 20. However, application of UV light to the storage layer 30 with the cell 20 in its programmed state (i.e., with electrons stored in the storage layer 30) can excite these stored electrons to undesirably cause them to dissipate and leave the storage layer 30, in turn undesirably causing the memory cell 20 to change from its programmed to its erased state. The SiRO layer 44 is a UV light blocking layer which is included for the purpose of absorbing UV light so as to shield the cell 20 (and storage layer 30) from UV light and thereby limit this problem, in turn increasing cell stability.

While the inclusion of such an SiRO layer 44 has proven effective for its desired purpose, it will be understood that improvements in this area are continually desired. For example, it has been found that the SiRO layer 44 can retain and conduct charge, for example electrons or Cu ions, which can result in undesirable conduction between conductor 50 and conductor 52 when different potentials are applied to these conductors, which can in turn cause reliability problems revealed by undertaking bias-temperature-stress (BTS) reliability tests.

Furthermore, the SiRO layer 44 has a high Si—H bonding content which has been linked to data retention issues of the cell 20, since with this high content, a high level of debonding can occur, which frees up hydrogen ions which may pass into the storage layer 30 to undesirably neutralize electrons stored in the storage layer 30.

Additionally, the etching of the SiRO layer 44 (for formation of openings therethrough for the conductors 50, 52) is a slow, time-consuming process, resulting in problems which will be described further on.

Therefore, what is needed is an approach wherein proper shielding of the memory cell from UV light is achieved, meanwhile overcoming the above problems.

SUMMARY OF THE INVENTION

Broadly stated, the present electronic structure comprises a memory cell, and a layer comprising silicon oxynitride overlying the memory cell.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
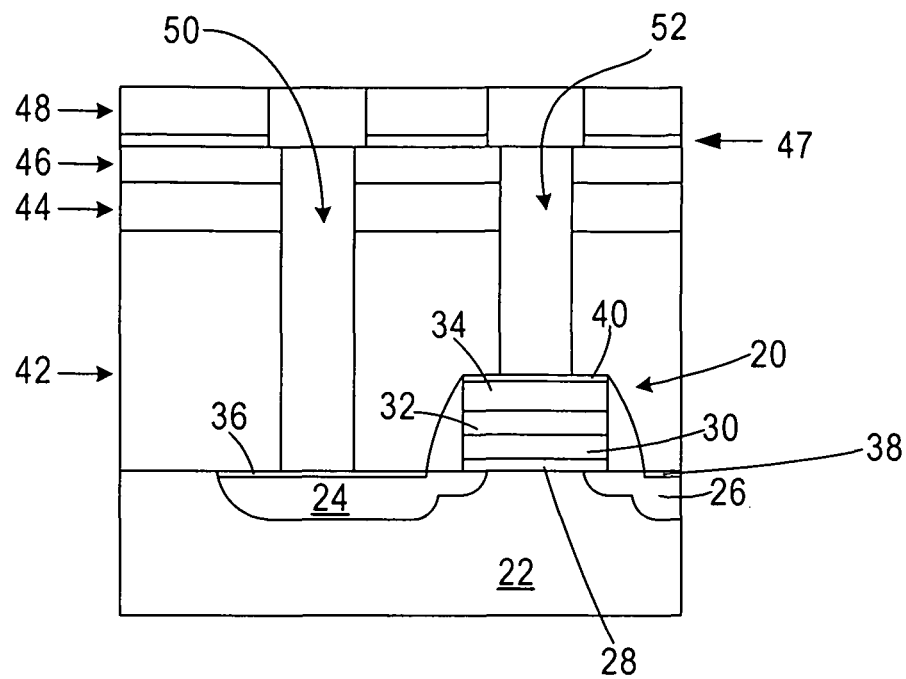
FIG. 1 illustrates a memory cell in accordance with the prior art.
Figure 2:
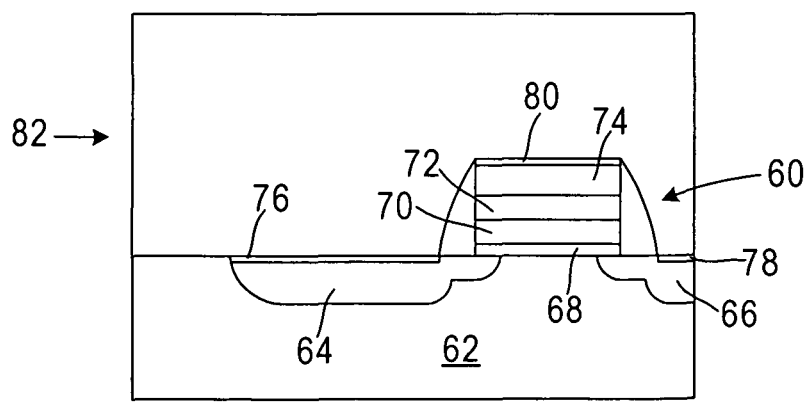
FIGS. 2-15 illustrate process steps in the formation of the present memory cell.

FIGS. 2-15 illustrate the fabrication of an electronic structure in accordance with the present invention. As shown in FIG. 2, an electrically programmable and erasable nonvolatile flash memory cell 60 in the form of a transistor is provided. As such, a semiconductor substrate 62 has source/drains 64, 66 formed therein. Successive layers of gate dielectric 68, storage layer 70, dielectric 72 and control gate 74 are formed on the substrate 62. Silicide conductive layers 76, 78, 80 are formed on the source/drains 64, 66 and the control gate 74 respectively. This memory cell 60 is programmable, upon application of appropriate voltages, by moving electrons from a source/drain through the gate dielectric 68 and into the storage layer 70, where such electrons are stored. The memory cell 60 is erasable, again upon application of appropriate voltages, by removing electrons from the storage layer 70 through the gate dielectric 68 and into a source/drain, as is well known. As illustrated in FIG. 2, a BPSG layer 82 is deposited over the memory cell 60.

Figure 3:
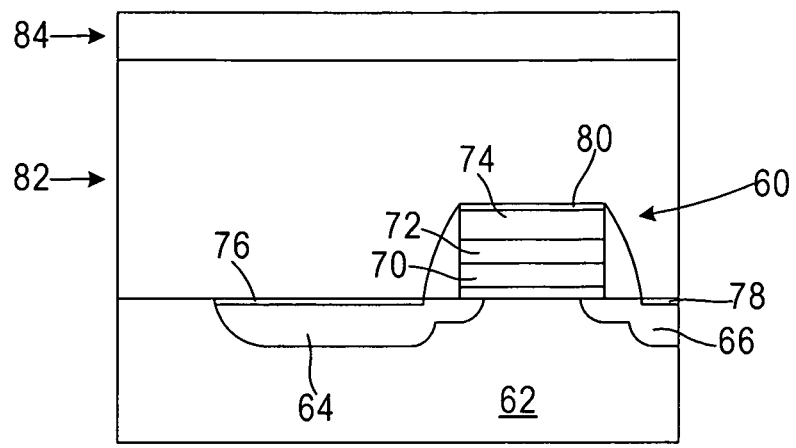
Figure 4:
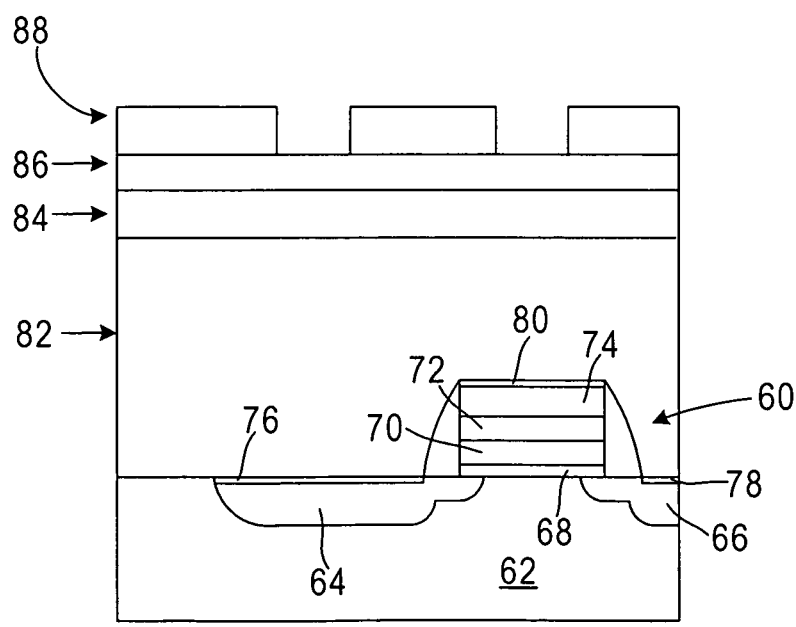
Figure 5:
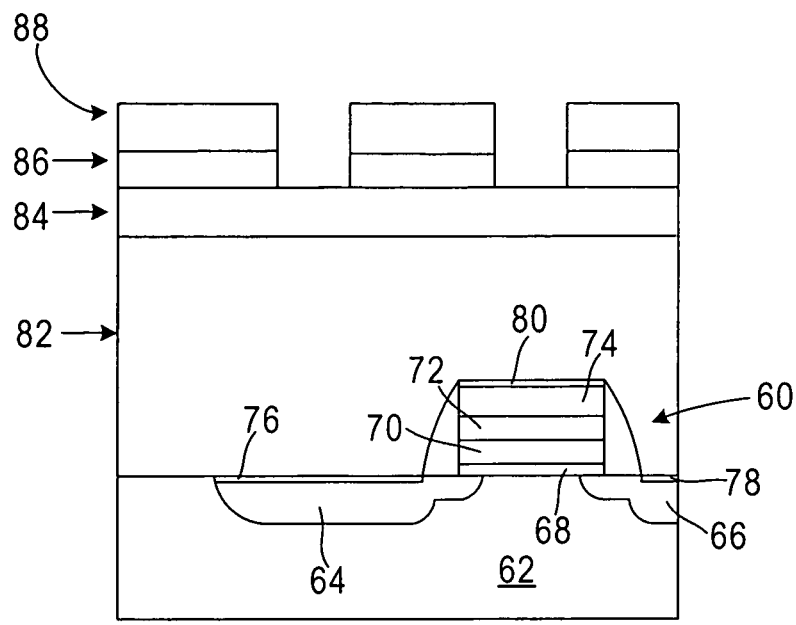
Figure 6:
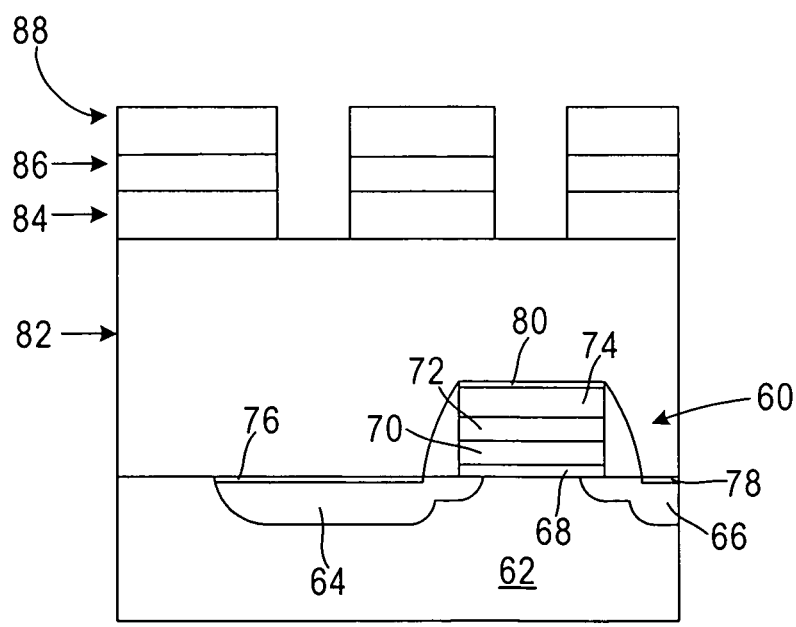
Figure 7:
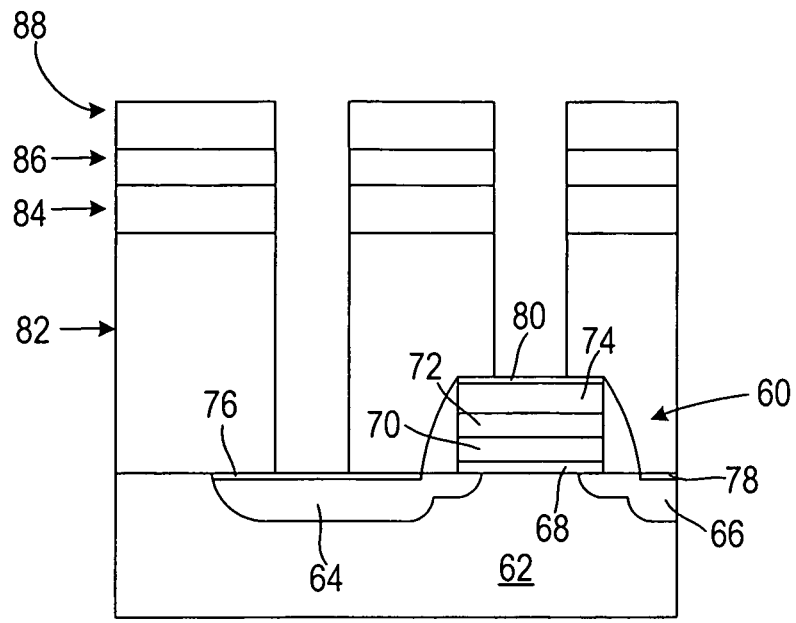

Referring next to FIG. 3, a silicon oxynitride (SiON) layer 84 is deposited over, on and in contact with the BPSG layer 82. The deposition process parameters for the silicon oxynitride layer 84 are as follows:

Temperature range: 200° C.-600° C., with preferred temperature of 500° C.
$SiH_4$ flow range: 50-1000 sccm, with preferred flow of 320 sccm
$N_2O$ flow range: 20-1000 sccm, with preferred flow of 160 sccm
$N_2$ flow range: 2000-30000 sccm, with preferred flow of 13000 sccm
RF Power range: 50 W-2 kW, with preferred power of 300 W
Pressure range: 0.5-10 Torr, with preferred pressure of 2 Torr Next (FIG. 4), a silicon dioxide cap layer 86 is deposited on, over and in contact with the silicon oxynitride layer 84. A layer of photoresist 88 is deposited over the silicon dioxide cap layer 86, and the photoresist 88 is patterned to provide openings therethrough to the silicon dioxide layer 86. Using the remaining photoresist 88 as a mask, successive etching steps are undertaken through the silicon dioxide layer 86, through the silicon oxynitride layer 84, and through the BPSG layer 82 (FIGS. 5, 6, and 7) to provide openings therethrough and expose the silicide layers 76, 80. The photoresist 88 is then removed.

Figure 8:
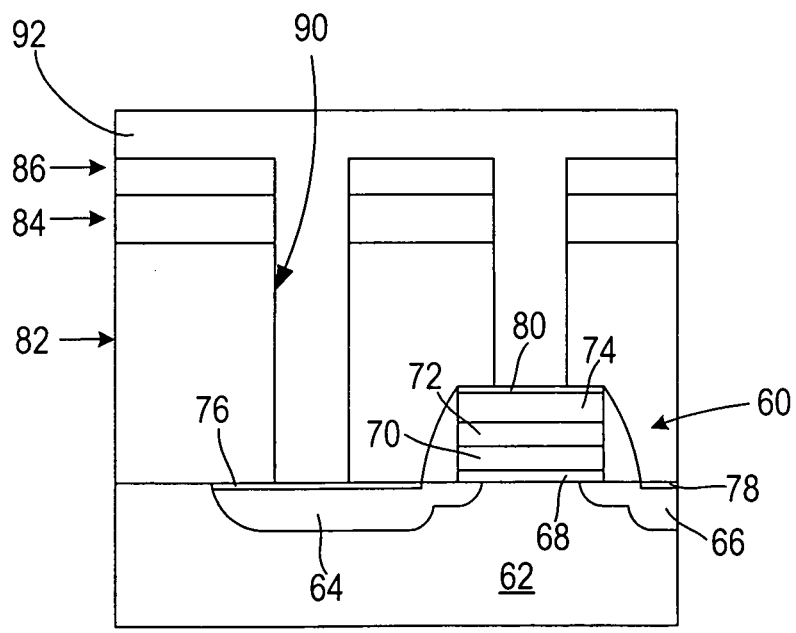
Figure 9:
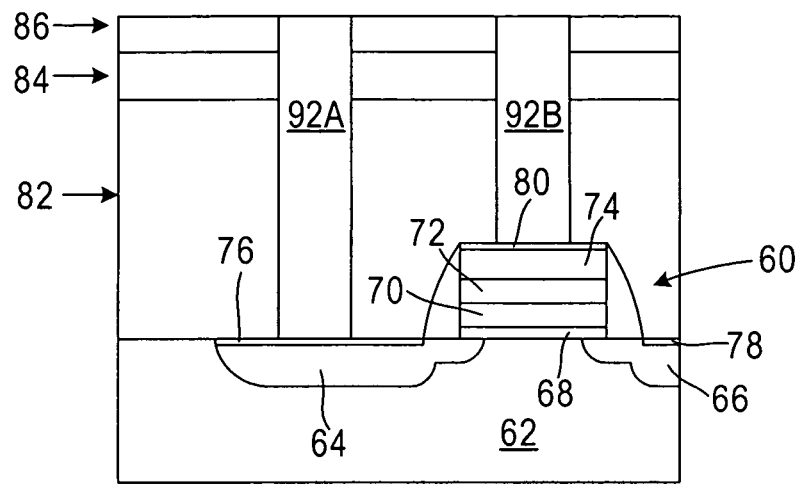

As illustrated in FIG. 8, after depositing a glue/barrier layer 90 (for example titanium, titanium nitride, or tungsten nitride), tungsten 92 is deposited over the resulting structure, filling the openings and electrically connecting with the silicide layers 76, 80. A chemical-mechanical (CMP) polishing step is undertaken to remove tungsten down to the level of the top of the silicon nitride dioxide layer 86 (FIG. 9), forming tungsten bodies 92A, 92B in the openings and in electrical connection with the silicide layers 76, 80 respectively for electrical connection with the source/drain 64 and control gate 74 respectively. The tungsten bodies 92A, 92B extend through the silicon dioxide cap layer 86, SiRO layer 84, and BPSG layer 82, and are electrically connected to silicide layer 76 and silicide layer 80 respectively.

Figure 10:
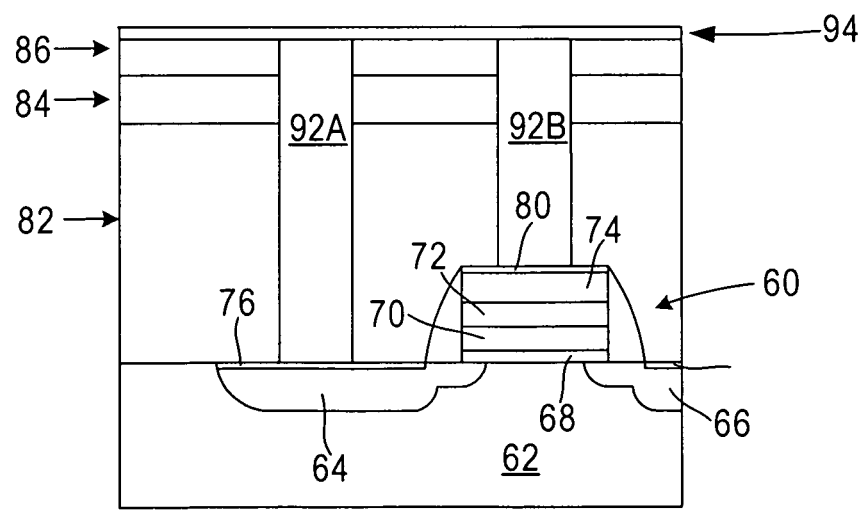
Figure 11:
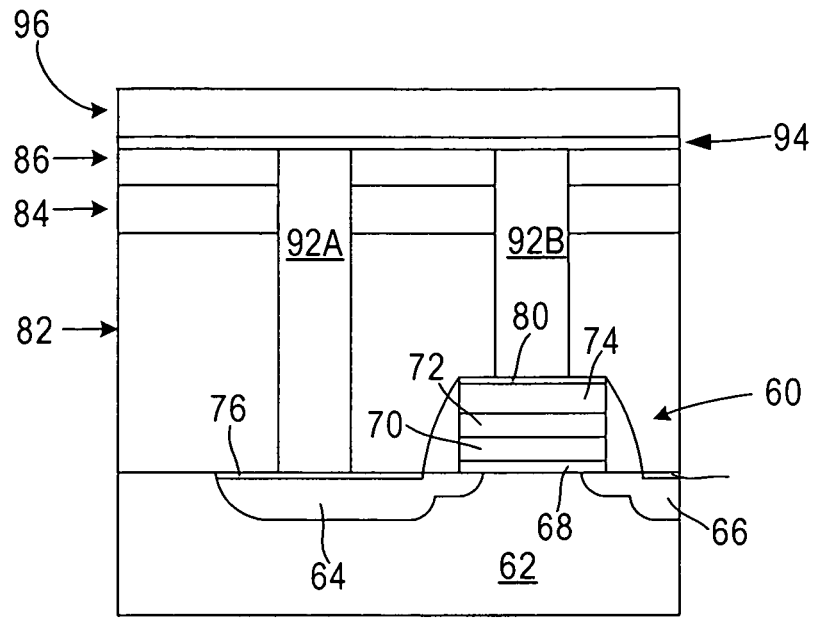
Figure 12:
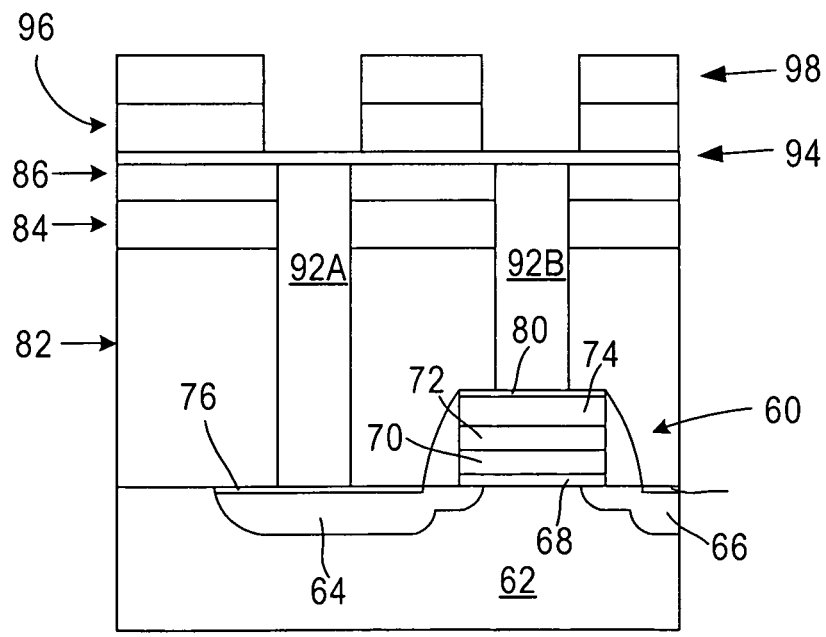
Figure 13:
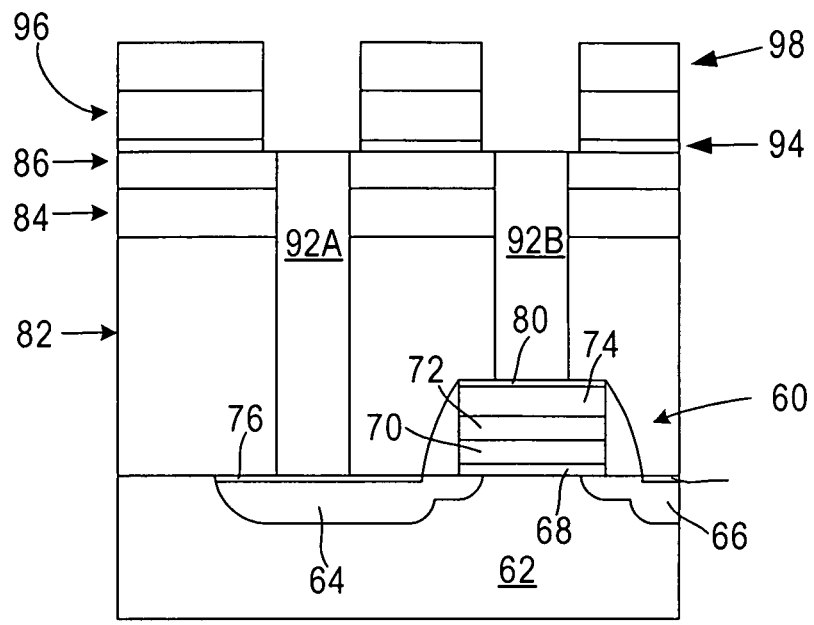

With reference to FIG. 10, a silicon nitride layer 94 is deposited over the resulting structure, and a silicon dioxide layer 96 is deposited on the silicon nitride layer 94 (FIG. 11). With reference to FIG. 12, layer of photoresist 98 is deposited over the silicon dioxide layer 96, and the photoresist is patterned to provide openings therethrough to the silicon dioxide layer 96. Using the remaining photoresist 98 as a mask, and using the silicon nitride layer 94 as an etch stop, an etching step is undertaken through the silicon dioxide layer 96 to provide openings therethrough and expose portions of the silicon nitride layer 94. The exposed silicon nitride of the silicon nitride layer 94 is then etched through, exposing the tungsten bodies 92A, 92B (FIG. 13). The photoresist 98 is then removed.

Figure 14:
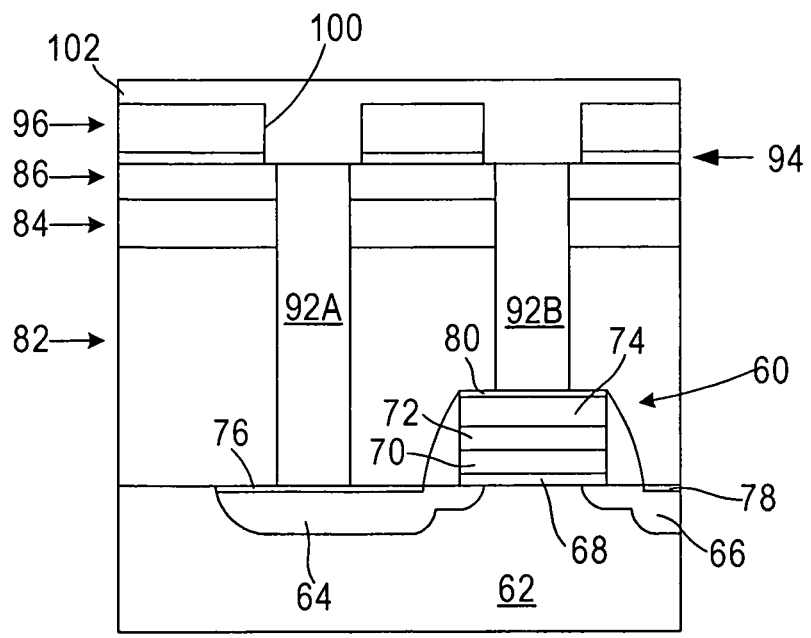
Figure 15:
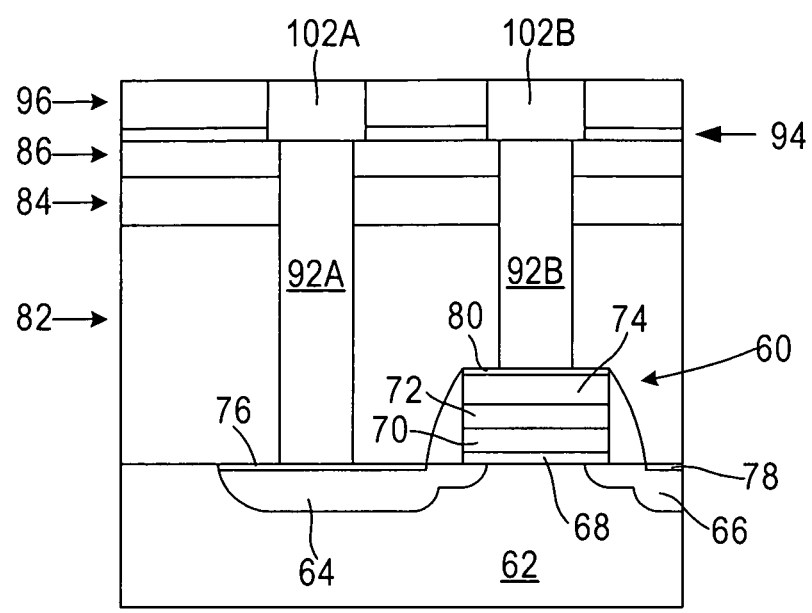

As illustrated in FIG. 14, after deposition of a glue/barrier layer 100 (for example tantalum, tantalum nitride, or tantalum/tantalum nitride), copper 102 is deposited over the resulting structure, filling the openings and electrically connecting with the tungsten bodies 92A, 92B. A chemical-mechanical (CMP) polishing step is undertaken to remove copper down to the level of the top of the silicon dioxide layer 96 (FIG. 15), forming copper bodies 102A, 102B in the openings in the silicon dioxide layer 96 and in electrical connection with the tungsten bodies 92A, 92B.

As will be seen, the silicon oxynitride layer 84, overlying the transistor memory cell 60 (and storage layer 70), replaces the SiRO layer 44 of the prior art. The conductive tungsten bodies 92A, 92B electrically connect respectively to the source/drain 64 (by connection with the silicide layer 76) and the control gate 74 (by connection with the silicide layer 80), and are disposed through the silicon oxynitride layer 84.

The SiON layer 84 is a UV light blocking layer which absorbs UV light so as to shield the cell 60 from UV light. For a given thickness, in the absorption of UV light, the prior art SiRO layer 44 and present SiON layer 84 have similar extinction coefficients (i.e., k~1.0 at light wavelength 248 nm). Additionally, the extinction coefficient of SiON can be tuned, so that this layer 84 can be made thinner than the prior are layer 44 while achieving the same UV light blocking property. As a result, a thinner interlayer dielectric stack can be achieved, providing reduced aspect ratio of the tungsten conductors 92A, 92B.

The SiON layer 84 has a higher nitrogen content and a higher film density than SiRO. These features reduce Cu mobility and improve performance in BTS reliability tests. The SiON layer 84 also has a lower Si—H bonding content as compared to SiRO, resulting in improvement in data retention.

Figure 16:
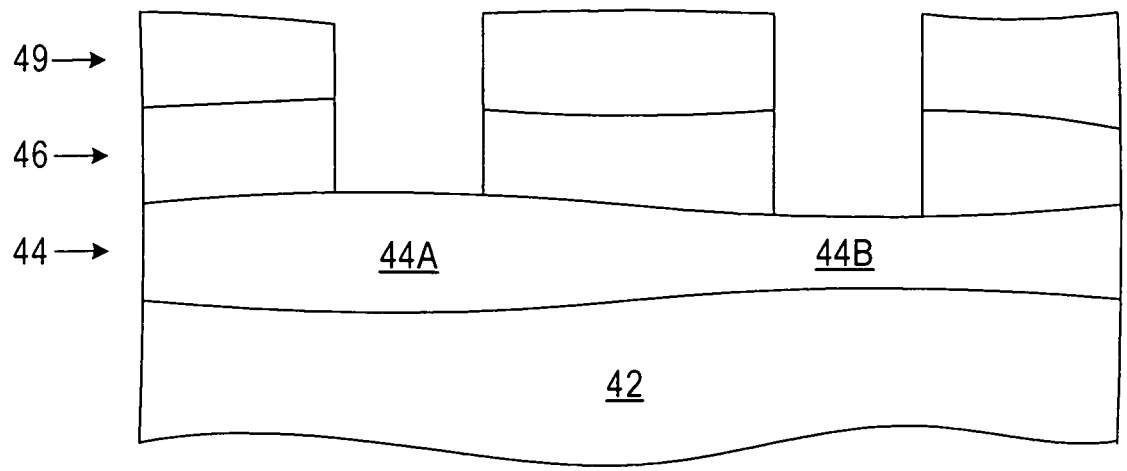
FIGS. 16-19 illustrate a comparison of etching of the prior art UV light blocking layer and the present UV light blocking layer.
Figure 17:
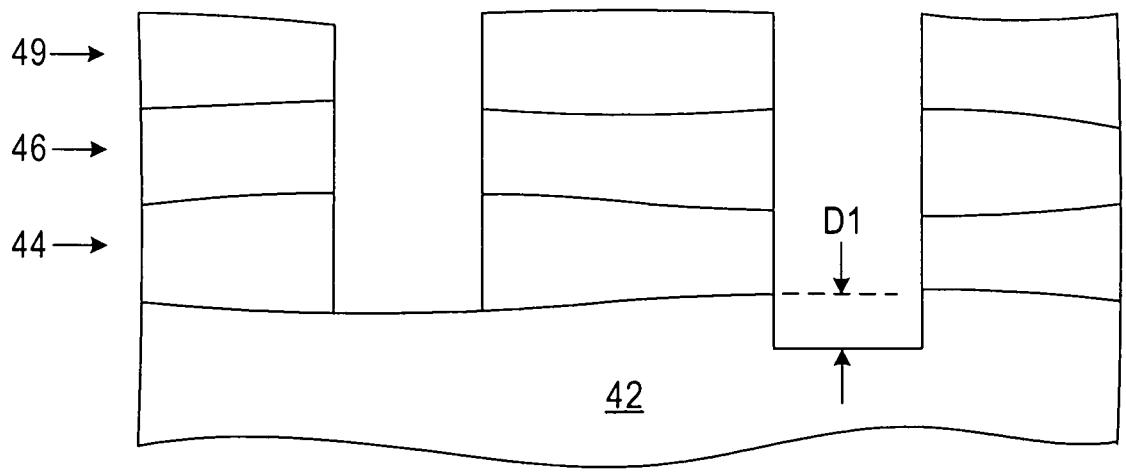

The problems arising from the slow etch of the prior art SiRO layer 44 and the present improvement thereover will now be described with reference to FIGS. 16-19. While the UV blocking layers in the prior art and in the present approach are each to have a uniform thickness, in reality, variations in thickness of these layers 44, 84 (and the other layers in the structure) occur. FIG. 16 illustrates these variations in thickness of the prior art SiRO layer 44 (exaggerated for clarity). In etching through the SiRO layer 44 (using patterned photoresist 49), the thickest portion 44A thereof exposed to etchant must be completely etched through. Meanwhile, a thinner portion 44B of the SiRO layer 44 exposed to etchant will be completely etched through prior to the thicker portion 44A being etched through. The etching must continue until the thicker portion 44A is fully and completely etched through. Because this etching is slow, a significant amount of overetch into the BPSG layer 42 occurs (overetch depth shown as D1, FIG. 17). Then, upon subsequent etching through the BPSG layer 42, the silicide layer 40 on the control gate 34 is exposed to this etching for a significant period of time, which may damage the silicide layer 40.

Figure 18:
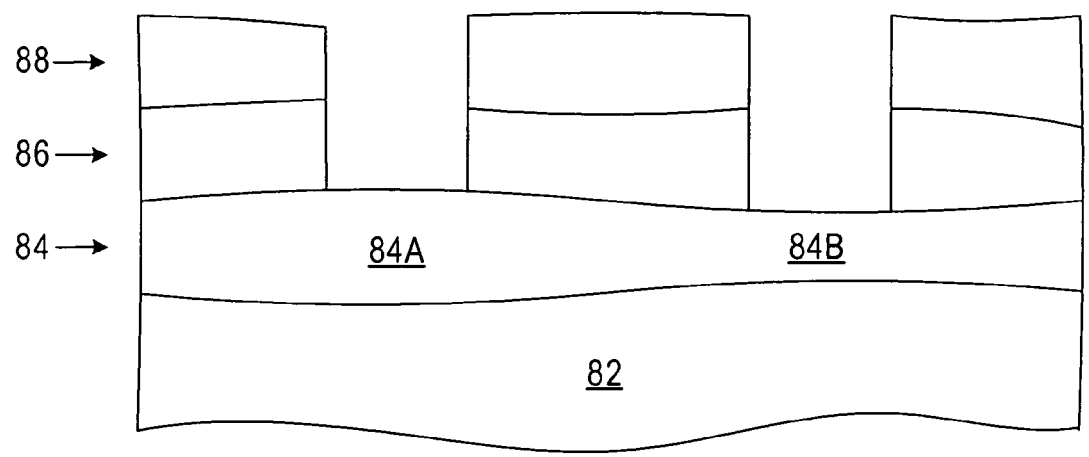
Figure 19:
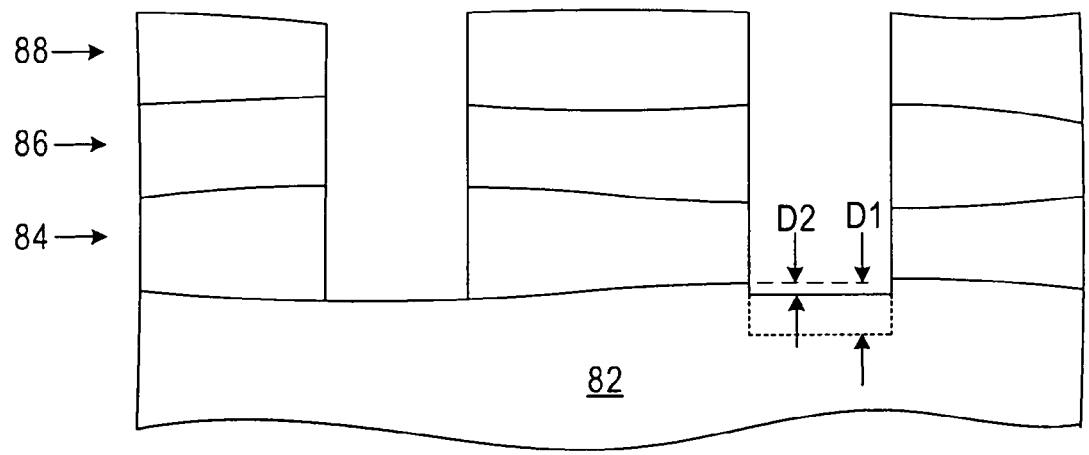

FIG. 18 illustrates the variations in thickness of the present SiON layer 84, similar to those of the prior art SiRO layer 44. Again, the etching (using patterned photoresist 88 as a mask) must continue until the thicker portion 84A is fully and completely etched through. Meanwhile, a thinner portion 84B of the SiON layer 84 exposed to etchant will be completely etched through prior to the thicker portion 84A being etched through. However, because etching through the SiON layer 84 takes place at a faster pace, i.e., is significantly more rapid than etching of the prior art SiRO, the BPSG layer 82 under the thinner portion 84B of the SiON layer 84 is exposed to etchant during this process for a significantly shorter time than in the prior art, resulting in significantly less overetch into the BPSG layer 82 (overetch depth shown as D2, and compared to D1 of the prior art, FIG. 19). Then, upon subsequent etching through the BPSG layer 82, the silicide layer 80 on the control gate 74 is exposed to this etching for a lesser period of time, aiding in avoiding damage to the silicide layer 80.

It will be observed that the problems recited above are overcome in the present approach.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic structure comprising:
a transistor comprising a control gate, wherein the control gate is a single layer;
an insulator layer overlying the transistor, wherein the insulator layer is a single layer;
a layer comprising silicon oxynitride overlying and in direct contact with the insulator layer;
a layer comprising silicon dioxide overlying and in direct contact with the layer comprising silicon oxynitride, wherein the layer of silicon oxynitride is a single layer;
a first conductor disposed through the insulator, the layer comprising silicon oxynitride, and the layer comprising silicon dioxide for electrical connection to the control gate, wherein the first conductor is electrically connected to the control gate through a first silicide conductive layer;
a silicon nitride layer overlying and in direct contact with the silicon dioxide layer and the first conductor;
a silicon dioxide layer overlying and in direct contact with the silicon nitride layer; and
a third conductor disposed through the silicon nitride layer and the silicon dioxide layer to electrically connect to the first conductor, wherein a glue/barrier layer is deposited between the third conductor and the silicon nitride layer and the silicon dioxide layer.

2. The electronic structure of claim 1 wherein the transistor further comprises a pair of source/drains, a gate insulator, a floating gate, and a dielectric layer.

3. The electronic structure of claim 2 and further comprising a second conductor disposed through the insulator, the layer comprising silicon oxynitride, and the layer comprising silicon dioxide for electrical connection to a source/drain, wherein the second conductor is electrically connected to the source/drain through a second silicide conductive layer.

4. A memory device comprising:
a memory cell comprising a transistor, wherein the transistor comprises a control gate, wherein the control gate is a single layer;
an insulator layer overlying the memory cell, wherein the insulator layer is a single layer;
a layer comprising silicon oxynitride overlying and in direct contact with the insulator layer;
a layer comprising silicon dioxide overlying and in direct contact with the layer comprising silicon oxynitride, wherein the layer of silicon oxynitride is a single layer;
a first conductor disposed through the insulator, the layer comprising silicon oxynitride, and the layer comprising silicon dioxide for electrical connection to the control gate, wherein the first conductor is electrically connected to the control gate through a first silicide conductive layer;
a silicon nitride layer overlying and in direct contact with the silicon dioxide layer and the first conductor;
a silicon dioxide layer overlying and in direct contact with the silicon nitride layer; and
a third conductor disposed through the silicon nitride layer and the silicon dioxide layer to electrically connect to the first conductor, wherein a glue/barrier layer is deposited between the third conductor and the silicon nitride layer and the silicon dioxide layer.

5. The memory device of claim 4 wherein the memory cell is a nonvolatile memory cell.

6. The memory device of claim 5, wherein the transistor further comprises a pair of source/drains, a gate insulator, a floating gate, and a dielectric layer.

7. The memory device of claim 4 and further comprising a second conductor disposed through the insulator, the layer comprising silicon oxynitride, and the layer comprising silicon dioxide for electrical connection to a source/drain, wherein the second conductor is electrically connected to the source/drain through a second silicide conductive layer.

8. A memory device comprising:
a nonvolatile memory cell comprising a transistor, wherein the transistor comprises a control gate, wherein the control gate is a single layer;
an insulator layer over and in direct contact with the memory cell;
a layer comprising silicon oxynitride over and in direct contact with the insulator;
a layer comprising silicon dioxide overlying and in direct contact with the layer comprising silicon oxynitride, wherein the layer of silicon oxynitride is a single layer;
a first conductor disposed through the insulator, the layer comprising silicon oxynitride, and the layer comprising silicon dioxide for electrical connection to the control gate, wherein the first conductor is electrically connected to the control gate through a first silicide conductive layer;
a silicon nitride layer overlying and in direct contact with the silicon dioxide layer and the first conductor;
a silicon dioxide layer overlying and in direct contact with the silicon nitride layer; and
a third conductor disposed through the silicon nitride layer and the silicon dioxide layer to electrically connect to the first conductor, wherein a glue/barrier layer is deposited between the third conductor and the silicon nitride layer and the silicon dioxide layer.

9. The memory device of claim 8 wherein the transistor further comprises a pair of source/drains, a gate insulator, a floating gate, and a dielectric layer.

10. The memory device of claim 8 and further comprising a second conductor disposed through the insulator, the layer comprising silicon oxynitride, and the layer comprising silicon dioxide for electrical connection to a source/drain, wherein the second conductor is electrically connected to the source/drain through a first silicide conductive layer.

11. The electronic structure of claim 1 wherein the insulator layer comprises Borophosphosilicate glass (BPSG).

12. The memory device of claim 4 wherein the insulator layer comprises Borophosphosilicate glass (BPSG).

13. The memory device of claim 8 wherein the insulator layer comprises Borophosphosilicate glass (BPSG).

14. The electronic structure of claim 1 further comprising a glue/barrier layer between the first conductor and the insulator, the layer comprising silicon oxynitride, and the layer comprising silicon dioxide.

15. The memory device of claim 4 further comprising a glue/barrier layer between the first conductor and the insulator, the layer comprising silicon oxynitride, and the layer comprising silicon dioxide.

16. The memory device of claim 8 further comprising a glue/barrier layer between the first conductor and the insulator, the layer comprising silicon oxynitride, and the layer comprising silicon dioxide.

* * * * *